United States Patent [19]

Chi

[11] Patent Number: 5,076,619

[45] Date of Patent: Dec. 31, 1991

[54] FASTENING PLATE FOR INTERFACE OF A PERSONAL COMPUTER

[75] Inventor: Liu Chi, Taoyuan, Taiwan

[73] Assignee: Enlight Corporation, Taoyuan, Taiwan

[21] Appl. No.: 633,233

[22] Filed: Dec. 21, 1990

[51] Int. Cl.[5] ............................................. E05C 19/06
[52] U.S. Cl. .................................... 292/17; 364/708; 439/135
[58] Field of Search ........................ 364/708; 439/557; 292/17, 19, DIG. 53

[56] References Cited

U.S. PATENT DOCUMENTS

| | | | |
|---|---|---|---|
| 1,887,611 | 11/1932 | Wittenberg | 292/17 X |
| 2,012,016 | 8/1935 | Ninde | 292/17 X |
| 2,342,831 | 2/1944 | Borchere | 292/17 |
| 3,402,384 | 9/1968 | Murakami et al. | 439/557 |
| 5,011,418 | 4/1991 | Perzentha, Jr. | 439/135 |

Primary Examiner—Richard E. Moore
Attorney, Agent, or Firm—Ladas & Parry

[57] ABSTRACT

An interface fastening plate adapted in a personal computer casing where predetermined interface expanding slots. A plurality of outwardly bent structure are provided along one of the lateral edges of the fastening plate as resilient positioning hooks of which are used to engage with the interface expanding slots.

1 Claim, 4 Drawing Sheets

FIG_1.

FIG._2.

FASTENING PLATE FOR INTERFACE OF A PERSONAL COMPUTER

BACKGROUND OF THE INVENTION

The present invention relates to a fastening plate for interface of a personal computer, in particular to a fastening plate which can be inserted into a predetermined interface expanding slot formed at the computer casing. A plurality of outwardly curved structure being formed along the edge of a covering plate of the fastening plate as resilient-positioning hooks provide quick mounting to the slots.

In conventional computer casing, a plurality of interface expanding slots are provided for the adaptation of computer interface to provide additional function of the computer. However, generally, the mounting of the interface fastening plate to the expanding slots by use of screws. As a result, during the manufacturing of computer casings, each of the interface fastening plate has to be tightened with screws, which is time-consuming and laborious. Beside, if different functional interface is to be mounted to provide additional function, the interface fastening plate mounted to the casing has to be dislocated with a screw driver so as to allow the mounting of the interface. It is a waste of time in such a work operation. Further, due to the narrow gap between the interface fastening plate and the interface expanding slot, electromagnetic interference (EMI) will be occurred.

SUMMARY OF THE INVENTION

It is therefore the primary object of the present invention to provide a fastening plate for interface, which will alleviate the above-mentioned drawbacks.

It is another object of the present invention to provide a fastening plate for interface, which provided a quick mounting and/or dismounting of interface to and/from the fastening plate.

It is another object of the present invention to provide a fastening plate for interface, which provide good contacting point between the interface expanding slot and the fastening plate, and will reduce the electromagnetic interference to a minimum.

Another object of the present invention is to provide a fastening plate for interface which is simple in construction and durable.

The attainment of the foregoing and related objects, advantages and features of the invention should be more readily apparent after review of the following more detailed description of the invention, taken together with the drawings, in which:

DETAILED DESCRIPTION OF THE INVENTION

Figure 1:
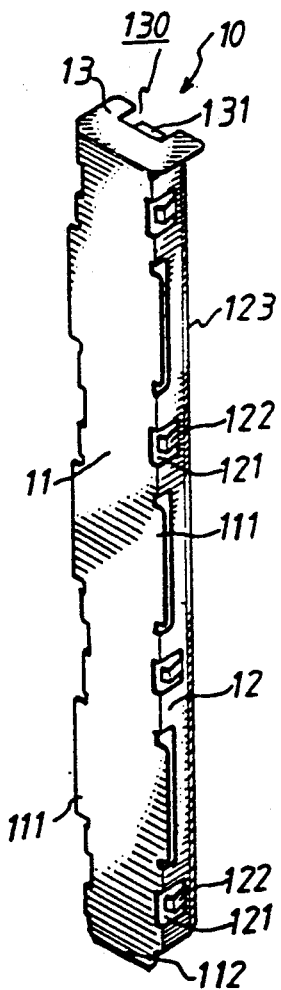
FIG. 1 is a perspective view showing the fastening plate for interface in accordance with the present invention.
Figure 2:
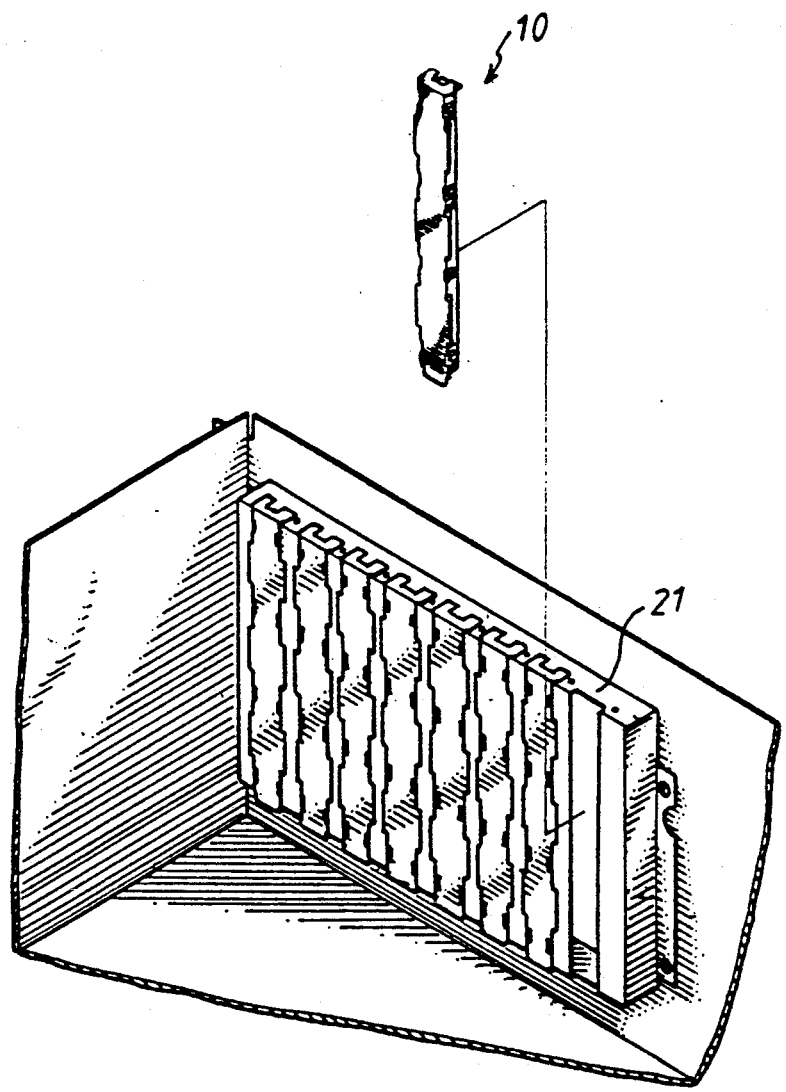
FIG. 2 is a schematic view showing the mounting of the fastening plate onto the interface expanding slot.

Turning now to the drawings, particularly to FIG. 1, which illustrates the interface fastening plate 10 in accordance with the present invention. As shown in the figure, the interface fastening plate 10 is an elongated plate having a covering plate 11. The extensions of the covering plate 11 are folded to form a pair of narrow faces 12 at right angle to the covering plate 11. The top end of the covering plate 11 is folded at right angle to form an engaging member 13. In other words, the engaging member 13 is also perpendicular to the narrow face 12. The engaging member 13 is substantially fork-shaped having a notch 130 at the middle position of the front edge thereof. A blocking element 131 is substantially L-shaped formed at the notch 130. The edges 123 of the narrow face 12 are slightly curved inward which facilitates the insertion of fastening plate 10 into the interface expanding slot 21, as shown in FIG. 2. Along the surface of the narrow face 12, a plurality of openings 121 are provided at a fixed interval thereon. For each opening, a positioning hook 122 is provided and extends slightly outwardly from the plane of the narrow face 12. As shown in FIG. 1, four resilient positioning hooks 122 at the openings 121. Along the other edge of the covering facing 11, a plurality of protruded structures 111 are provided thereon.

Figure 3:
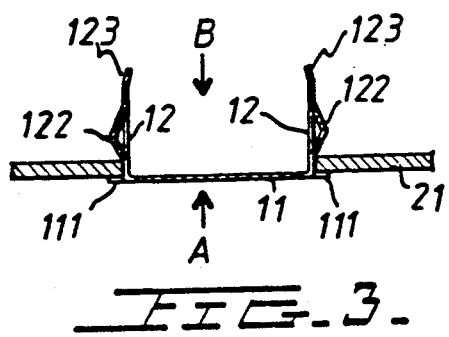
FIG. 3 is a sectional view showing the expanding slot and the engagement of the resilient positioning hooks with the expanding slot.
Figure 4:
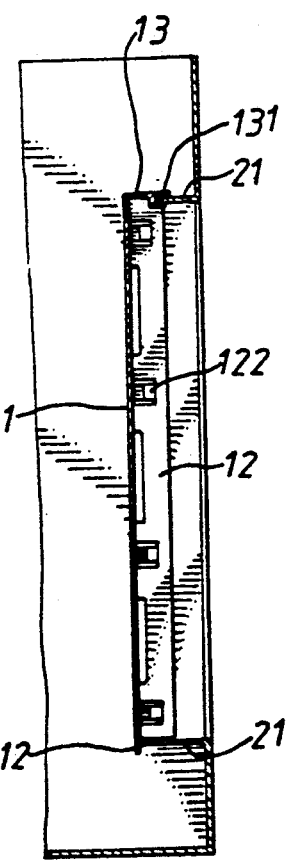
FIG. 4 is a sectional view showing the engagement of the fastening with the interface expanding slot.

Referring now to FIGS. 3 and 4, there is shown the interface fastening plate 10 being mounted onto the interface expanding slot 21 predetermined at the computer casing. FIG. 3 is a sectional view showing the interface fastening plate 10 being mounted onto the interface expanding slot 21. As also indicated in figure, the engagement of the resilient positioning hook 122 into the slot 21 is shown. If the interface fastening plate 10 is to be mounted, the interface fastening plate 10 is pressed in the direction of A as shown in FIG. 3. Owing to the resiliency of the positioning hook 122, the positioning hook 122 is retracted under the urging of the inner edge of the interface expanding slot 21. Thus, it is convenient to insert interface fastening plate 10 into the interface expanding slot 21 until the protruded structure 111 at the edge of the covering face 11 is blocked by the inner edge of the expanding slot 21. At this instance, the resilient positioning hook 122 is extended outwardly and is engaged at the edge of the expanding slot 21, as shown in FIG. 3. If the interface fastening plate 10 is to be dislocated from the expanding slot 21, it is pressed in the direction B shown in FIG. 3 (i.e., the opposite direction to A), and the resilient positioning hook 122 will urge inward, such that the interface fastening plate 10 will smoothly disengage from the expanding slot 21. FIG. 4 is a sectional view showing the mounting of interface fastening plate 10 onto the interface expanding slot 21. It also shows that other than the protruded structure 111 is used to block the fastening plate 10, the blocking element 131 of the engaging member 13 and the bottom end 112 of the covering plate 11 are also used to block the fastening plate 10. Thus, the interface fastening plate 10 is very- stable after it has mounted to the expanding slot 21. When the interface fastening plate 10 is in engagement with the interface slot 21, the contact between the resilient positioning hook 122 and the extension slot 21 will reduce the electromagnetic interference to a minimum.

Figure 5:
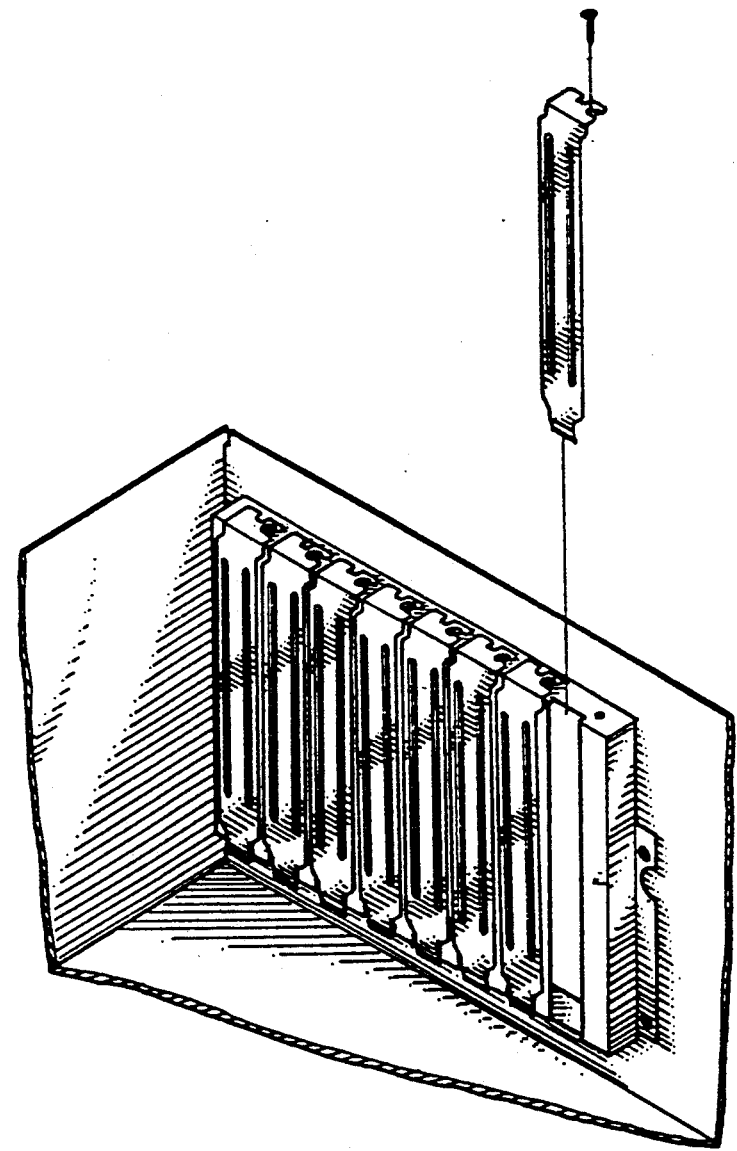
FIG. 5 is a conventional fastening plate for interface.

FIG. 5 illustrates a conventional interface fastening plate mounting to an expanding slot. A screw driver is needed to tighten the screws for mounting of a fastening plate. In another word, it is troublesome to dislocate the fastening plate if a interface is to be mounted to the computer.

It will be apparent to those skilled in the art that various modifications and variations could be made in the present invention without departing from the scope or spirit of the invention.

I claim:

1. An interface fastening plate having an elongated shaped structure comprising;

a covering plate (11) provided with a plurality of protruded structures (111) at both edges thereof;

an engaging member (13) being formed at right angle to said covering plate at one end thereof, said engaging member (13) is substantially fork-shaped having a notch (130) at the middle position of the front edge thereof; a blocking element (131) being substantially L-shaped formed at the notch (130);

a pair of narrow faces (12) being formed perpendicular to the covering plate (11) at the edges thereof, a plurality of openings (121) each provided with resilient positioning hooks (122) being formed at a spaced intervals and curved outwardly along the surface of the narrow faces (12).

* * * * *

UNITED STATES PATENT AND TRADEMARK OFFICE
CERTIFICATE OF CORRECTION

PATENT NO. : 5,076,619
DATED : December 31, 1991
INVENTOR(S) : Chi Liu

It is certified that error appears in the above-indentified patent and that said Letters Patent is hereby corrected as shown below:

On the Title page, items [19] and [75], Inventor: delete "Liu Chi"

and insert --Chi Liu

Signed and Sealed this

Twenty-eighth Day of September, 1993

*Attest:*

BRUCE LEHMAN

*Attesting Officer*     *Commissioner of Patents and Trademarks*